(12) United States Patent
Cho

(10) Patent No.: US 9,502,591 B2
(45) Date of Patent: Nov. 22, 2016

(54) DEVICE FOR GENERATING PHOTOVOLTAIC POWER AND MANUFACTURING METHOD FOR SAME

(75) Inventor: Ho Gun Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 439 days.

(21) Appl. No.: 13/813,346

(22) PCT Filed: Aug. 1, 2011

(86) PCT No.: PCT/KR2011/005639
§ 371 (c)(1),
(2), (4) Date: Feb. 6, 2013

(87) PCT Pub. No.: WO2012/015286
PCT Pub. Date: Feb. 2, 2012

(65) Prior Publication Data
US 2013/0125980 A1 May 23, 2013

(30) Foreign Application Priority Data
Jul. 30, 2010 (KR) .................. 10-2010-0074415

(51) Int. Cl.
H01L 31/0224 (2006.01)
H01L 31/18 (2006.01)
H01L 31/02 (2006.01)
H01L 31/046 (2014.01)

(52) U.S. Cl.
CPC ... H01L 31/022441 (2013.01); H01L 31/0201 (2013.01); H01L 31/022425 (2013.01); H01L 31/046 (2014.12); H01L 31/18 (2013.01); Y02E 10/50 (2013.01)

(58) Field of Classification Search
CPC . Y02E 10/541; Y02E 10/543; H01L 31/073; H01L 31/1828; H01L 31/0749; H01L 31/03923

USPC ......................................................... 136/256
See application file for complete search history.

(56) References Cited

U.S. PATENT DOCUMENTS 5,259,891 A * 11/1993 Matsuyama et al. ......... 136/244
5,679,176 A * 10/1997 Tsuzuki ............ H01L 31/03921
136/244
6,300,556 B1 10/2001 Yamagishi et al.
6,469,242 B1 * 10/2002 Kondo .................. B32B 17/02
136/244

(Continued)

FOREIGN PATENT DOCUMENTS

JP 2001-339081 7/2001
JP 2001-210850 A 8/2001

(Continued)

OTHER PUBLICATIONS

International Search Report in International Application No. PCT/KR2011/005639, filed Aug. 1, 2011.

(Continued)

*Primary Examiner* — Marla D McConnell
*Assistant Examiner* — Sadie White
(74) *Attorney, Agent, or Firm* — Saliwanchik, Lloyd & Eisenschenk

(57) ABSTRACT

Disclosed is a solar cell apparatus. The solar cell apparatus include: a substrate; a back electrode layer on the substrate; a light absorbing layer on the back electrode layer; a window layer on the light absorbing layer; and a bus bar provided beside the light absorbing layer, the bus bar being connected to the back electrode layer.

9 Claims, 4 Drawing Sheets

(56) References Cited

U.S. PATENT DOCUMENTS

| | | | | |
|---|---|---|---|---|
| 2011/0018089 A1* | 1/2011 | Hakuma | ............ | H01L 31/0749 257/463 |
| 2011/0065228 A1* | 3/2011 | Li | ................... | H01L 21/02568 438/94 |
| 2011/0088750 A1 | 4/2011 | Stolt et al. | | |
| 2011/0259395 A1* | 10/2011 | Wieting et al. | ............... | 136/246 |
| 2011/0308545 A1* | 12/2011 | Luechinger et al. | ............ | 134/6 |

FOREIGN PATENT DOCUMENTS

| | | |
|---|---|---|
| JP | 2002-373995 | 12/2002 |
| JP | WO 2009110092 A1 * | 9/2009 ......... H01L 31/0749 |
| KR | 10-2009-0035796 A | 4/2009 |
| KR | 10-2010-0003048 A | 1/2010 |
| KR | 10-2010-0069354 A | 6/2010 |
| WO | WO-2009/151396 A1 | 12/2009 |
| WO | WO 2010096600 A2 * | 8/2010 |

OTHER PUBLICATIONS

Office Action dated Dec. 25, 2014 in Chinese patent Application No. 201180047748.1.

Office Action dated Nov. 26, 2013 in Japanese Application No. 2013-523091, filed Jun. 17, 2013.

Office Action dated Aug. 24, 2015 in Chinese patent Application No. 201180047748.1.

* cited by examiner

DEVICE FOR GENERATING PHOTOVOLTAIC POWER AND MANUFACTURING METHOD FOR SAME

CROSS-REFERENCE TO RELATED APPLICATIONS

This application is the U.S. national stage application of International Patent Application No. PCT/KR2011/005639, filed Aug. 1, 2011, which claims priority to Korean Application No. 10-2010-0074415, filed Jul. 30, 2010 the disclosures of each of which are incorporated herein by reference in their entirety.

TECHNICAL FIELD

The embodiment relates to a solar cell apparatus and a method of manufacturing the same.

BACKGROUND ART

Recently, as energy consumption is increased, solar cells to convert the solar light into electrical energy have been developed.

In particular, a CIGS-based solar cell apparatus, which is a PN hetero junction apparatus having a substrate structure including a glass substrate, a metallic back electrode layer, a P-type CIGS-based light absorbing layer, a high-resistance buffer layer, and an N-type window layer, has been extensively used.

Various studies and researches have been performed to improve electrical characteristics of the solar cell apparatus, such as low resistance and high transmittance.

DISCLOSURE

Technical Problem

The embodiment provides a solar cell apparatus capable of representing improved power generation efficiency and a method of manufacturing the same.

Technical Solution

According to the embodiment, there is provided a solar cell apparatus including: a substrate; a back electrode layer on the substrate; a light absorbing layer on the back electrode layer; a window layer on the light absorbing layer; and a bus bar provided beside the light absorbing layer, the bus bar being connected to the back electrode layer.

According to the embodiment, there is provided a solar cell apparatus including: a substrate including an active area and a non-active area surrounding the active area; a first bus bar in the non-active region; a first cell in the active area; and a first connection electrode connecting the first cell to the first bus bar, wherein the first cell comprises: a first back electrode on the substrate; a first light absorbing part on the first back electrode; and a first window on the first light absorbing part, and wherein the first connection electrode extends from the first back electrode to the non-active region.

According to the embodiment, there is provided a method of manufacturing a solar cell apparatus, the method including: forming a back electrode layer on a substrate; forming a bus bar on the back electrode layer; forming a light absorbing layer beside the bus bar on the back electrode layer; and forming a window layer on the light absorbing layer.

Advantageous Effects

The solar cell apparatus according to the embodiment includes the bus bar connected to the back electrode layer. Accordingly, contact resistance between the back electrode layer and the bus bar can be reduced. Therefore, electric loss between the back electrode layer and the bus bar can be reduced, and the solar cell apparatus according to the embodiment can represent improved electrical properties.

Further, since the bus bar is coupled with the back electrode layer including metal, even if the bus bar has a narrow width, a coupling characteristic between the bus bar and the back electrode layer is not reduced. Accordingly, a width of the bus bar can be reduced.

In addition, the bus bar is disposed beside the light absorbing layer, that is, in a non-active region. Accordingly, an effective area of the solar cell apparatus according to the embodiment can be increased, and the solar cell apparatus according to the embodiment can represent improved power generation efficiency.

BEST MODE

Mode for Invention

Figure 1:
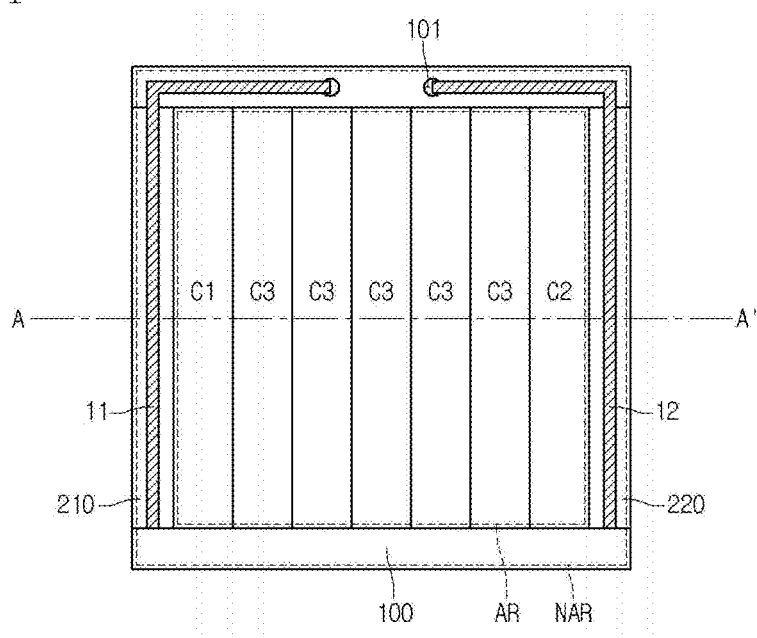
FIG. 1 is a plan view showing a solar cell apparatus according to the embodiment.

In the description of the embodiments, it will be understood that when a substrate, a layer, a film, or an electrode, is referred to as being "on" or "under" another substrate, another layer, another film, or another electrode, it can be "directly" or "indirectly" on the other panel, the other bar, the other frame, the other substrate, the other groove, the other film, or one or more intervening layers may also be present. Such a position of the layer has been described with reference to the drawings. The size of the elements shown in the drawings may be exaggerated for the purpose of explanation and may not utterly reflect the actual size.

Figure 2:
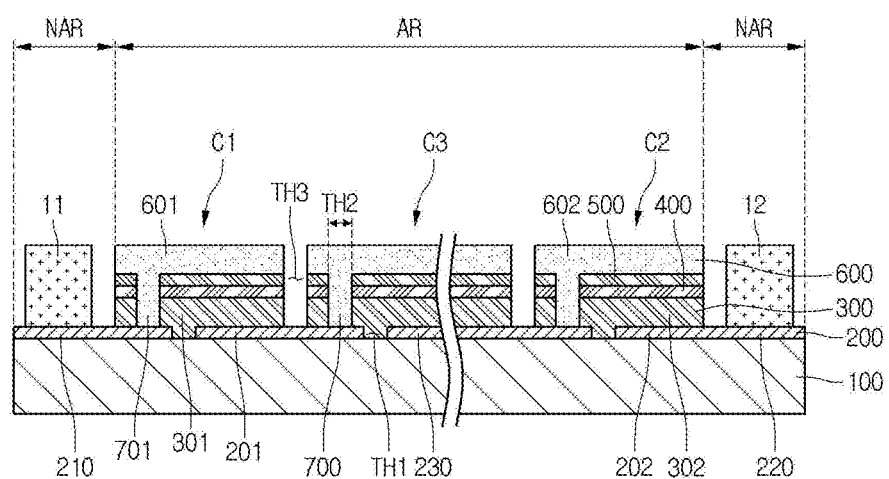
FIG. 2 is a sectional view taken along line A-A' of FIG. 1.

FIG. 1 is a plan view showing a solar cell apparatus according to the embodiment. FIG. 2 is a sectional view taken along line A-A' of FIG. 1.

Referring to FIGS. 1 and 2, the solar cell apparatus according to the embodiment includes a support substrate 100, a back electrode layer 200, a first bus bar 11, a second bus bar 12, a light absorbing layer 300, a buffer layer 400, a high resistance buffer layer 500, and a window layer 600.

The support substrate 100 has a plate shape, and supports the back electrode layer 200, the first bus bar 11, the second bus bar 12, the light absorbing layer 300, the buffer layer 400, the high resistance buffer layer 500, and the window layer 600.

The support substrate 100 may be an insulator. The support substrate 100 may be a glass substrate or a metal substrate. In detail, the support substrate 100 may be a soda lime glass substrate. The support substrate 100 may be transparent. The support substrate 100 may be rigid or flexible.

The support substrate 100 includes an active region AR and a non-active region NAR. In other words, the support substrate 100 is divided into the active region AR and the non-active region NAR.

The active region AR is defined at the central portion of the support substrate 100. The active region AR occupies the most part of the area of the support substrate 100. The solar cell apparatus according to the embodiment converts the solar light into electrical energy at the active region AR.

The non-active region NAR surrounds the active region AR. The non-active region NAR corresponds to the outer peripheral portion of the support substrate 100. The non-active region NAR may have an area very narrower than that of the active region AR. The non-active region NAR is a region in which power is not generated.

The back electrode layer 200 is provided on the support substrate 100. The back electrode layer 200 is a conductive layer. The back electrode layer 200 may include metal such as molybdenum (Mo). The back electrode layer 200 is formed in the active region AR and the non-active region NAR.

The back electrode layer 200 may include at least two layers. In this case, the layers may include homogeneous metal or heterogeneous metals.

The back electrode 200 is provided therein with first through holes TH1. The first through holes TH1 are open regions to expose the top surface of the support substrate 100. When viewed in a plan view, the first through holes TH1 may have a shape extending in one direction.

The first through holes TH1 may have a width in the range of about 80 µm to about 200 µm. The back electrode layer 200 is divided into a plurality of back electrodes 201, 202, and 230 and two connection electrodes 210 and 220 by the first through holes TH1. The back electrodes 201, 202, and 230 and the first and second connection electrodes 210 and 220 are defined by the first through holes TH1. The back electrode layer 200 includes the back electrodes 201, 202, and 230 and the first and second connection electrodes 210 and 220.

The back electrodes 201, 202, and 230 are provided in the active region AR. The back electrodes 201, 202, and 230 are provided in parallel to each other. The back electrodes 201, 202, and 230 are spaced apart from each other by the first through holes TH1. The back electrodes 201, 202, and 230 are provided in the form of a stripe.

Alternatively, the back electrodes 201, 202, and 230 may be provided in the form of a matrix. In this case, the first through holes TH1 may be formed in the form of a lattice when viewed in a plan view.

The first and second connection electrodes 210 and 220 are provided in the non-active region NAR. In other words, the first and second connection electrodes 210 and 220 extend from the active region AR to the non-active region NAR.

In more detail, the first connection electrode 210 is connected to a window of a first cell C1. In addition, the second connection electrode 220 extends from the back electrode of a second cell C2 to the non-active region NAR. In other words, the second connection electrode 220 may be integrally formed with the back electrode 202 of the second cell C2.

The first bus bar 11 is provided in the non-active region NAR. The first bus bar 11 is provided on the back electrode layer 200. In more detail, the first bus bar 11 is provided on the first connection electrode 210. The first bus bar 11 may directly make contact with the top surface of the first connection electrode 210.

The first bus bar 11 extends in parallel to the first cell C1. The first bus bar 11 may extend to the bottom surface of the support substrate 100 through a hole formed in the support substrate 100. The first bus bar 11 is connected to the first cell C1. In more detail, the first bus bar 11 is connected to the first cell C1 through the first connection electrode 210.

The second bus bar 12 is provided in the non-active region NAR. The second bus bar 12 is provided on the back electrode layer 200. In more detail, the bus bar 12 is provided on the second connection electrode 220. The second bus bar 12 may directly make contact with the second connection bar 220.

The second bus bar 12 extends in parallel to the second cell C2. The second bus bar 12 may extend to the bottom surface of the support substrate 100 through the hole formed in the support substrate 100. The second bus bar 12 is connected to the second cell C2. In more detail, the second bus bar 12 is connected to the second cell C2 through the second connection electrode 220.

The first and second bus bars 11 and 12 face each other. In addition, the first bus bar 11 is symmetric to the second bus bar 12. The first bus bar 11 and the second bus bar 12 include conductors. The first and second bus bars 11 and 12 may include metal such as silver (Ag) representing high conductivity.

The first bus bar 11 and the second bus bar 12 may be electrically connected to an adjacent solar cell module or storage battery through an additional wire.

The light absorbing layer 300 is provided on the back electrode layer 200. In addition, a material constituting the light absorbing layer 300 is filled in the first through holes TH1. The light absorbing layer 300 is provided in the active region AR. In more detail, the outer peripheral portion of the light absorbing layer 300 may correspond to the outer peripheral portion of the active region AR.

The light absorbing layer 300 includes a group I-III-VI compound. For example, the light absorbing layer 300 may have a Cu(In,Ga)Se2 (CIGS) crystal structure, a Cu(In)Se2 crystal structure, or a Cu(Ga)Se2 crystal structure.

The light absorbing layer 300 has an energy bandgap in the range of about 1 eV to about 1.8 eV.

The buffer layer 400 is provided on the light absorbing layer 300. In addition, the buffer layer 400 is provided in the active region AR. The buffer layer 400 includes CdS and has an energy bandgap in the range of about 2.2 eV to about 2.4 eV.

The high resistance buffer layer 500 is provided on the buffer layer 400. In addition, the high resistance buffer layer 500 is provided in the active region AR. The high resistance buffer layer 500 may include iZnO, which is zinc oxide not doped with impurities. The high resistance buffer layer 500 has an energy bandgap in the range of about 3.1 eV to about 3.3 eV.

The light absorbing layer 300, the buffer layer 400, and the high resistance buffer layer 500 are formed therein with second through holes TH2. The second through holes TH2 are formed through the light absorbing layer 300. In addition, the second through holes TH2 are open regions to expose the top surface of the back electrode layer 200.

The second through holes TH2 are adjacent to the first through holes TH1. In other words, when viewed in a plan view, portions of the second through holes TH2 are formed beside the first through holes TH1.

Each of the second through holes TH2 may have a width in the range of about 80 µm to about 200 µm.

In addition, a plurality of light absorbing parts are defined in the light absorbing layer 300 by the second through holes TH2. In other words, the light absorbing layer 300 is divided into the light absorbing parts by the second through holes TH2.

In addition, the buffer layer 400 is divided into a plurality of buffers by the second through holes TH2. Similarly, the high resistance buffer layer 500 is divided into a plurality of high resistance buffers by the second through holes TH2.

The window layer 600 is provided on the high resistance buffer layer 500. The window layer 600 is provided in the active region AR.

The window layer 600 is transparent and a conductive layer. In addition, the resistance of the window layer 600 is higher than the resistance of the back electrode layer 200. For example, the resistance of the window layer 600 is about 100 times to 200 times greater than the resistance of the back electrode layer 200.

The window layer 600 includes oxide. For example, the window layer 600 may include zinc oxide, indium tin oxide (ITO), or indium zinc oxide (IZO).

In addition, the oxide may include conductive impurities such as aluminum (Al), alumina (Al2O3), magnesium (Mg), or gallium (Ga). In other words, the window layer 600 may include Al doped zinc oxide (AZO) or Ga doped zinc oxide (GZO). The thickness of the window layer 600 may be in the range of about 800 nm to about 1200 nm.

The light absorbing layer 300, the buffer layer 400, the high resistance buffer layer 500, and the window layer 600 are formed therein with third through holes TH3. The third through holes TH3 are open regions to expose the top surface of the back electrode layer 200. For example, the width of the third through holes TH3 may be in the range of about 80 µm to about 200 µm.

The third through holes TH3 are adjacent to the second through holes TH2. In more detail, the third through holes TH3 are formed beside the second through holes TH2. In other words, when viewed in a plan view, the third through holes TH3 are formed beside the second through holes TH2.

The window layer 600 is divided into a plurality of windows by the third through holes TH3. In other words, the windows are defined by the third through holes TH3.

The windows 600 have a shape corresponding to that of the back electrodes 201, 202, and 230. In other words, the windows are arranged in the form of a stripe. In addition, the windows 600 may be arranged in the form of a matrix.

The window layer 600 includes a plurality of connection parts 700 formed by filling transparent conductive material in the second through holes TH2.

In addition, the first cell C1, the second cell C2, and a plurality of third cells C3 are defined by the third through holes TH3. In more detail, the first to third cells C1 to C3 are defined by the second through holes TH2 and the third through holes TH3. In other words, the solar cell apparatus according to the embodiment includes the first cell C1, the second cell C2, and the third cells C3 provided on the support substrate 100.

The third cells C3 are interposed between the first cell C1 and the second cell C2. The first cell C1, the second cell C2, and the third cells C3 are connected to each other in series.

The first cell C1 may include a back electrode 201, an light absorbing part 301, a buffer, a high resistance buffer, and a window 601 which are sequentially laminated on the support substrate 100. In this case, the window 601 of the first cell C1 is connected to the first bus bar 11 through a connection part 701 and the first connection electrode 210. That is, the first bus bar 11 is connected to the first cell C1 through the first connection electrode 210. In detail, the first bus bar 11 is connected to the window 601 of the first cell C1 through the first connection electrode 210.

The second cell C2 includes a back electrode 202, a light absorbing part 302, a buffer, a high resistance buffer, and a window 602 which are sequentially laminated on the support substrate 100. In this case, the back electrode 202 of the second cell C2 is connected to the second bus bar 12 through the second connection electrode 220. That is, the second bus bar 12 is connected to the second cell C2 through the second connection electrode 220. In detail, the second bus bar 12 is connected to the back electrode 202 of the second cell C2 through the second connection electrode 220. In this case, the back electrode 220 of the second cell C2 may be integrally formed with the second connection electrode 220.

The connection parts 700 are provided inside the second through holes TH2. The connection parts 700 extend downward from the window layer 600, so that the connection parts 700 are connected to the back electrode layer 200.

Therefore, the connection parts 700 connect adjacent cells to each other. In more detail, the connection parts 700 connect windows and back electrodes, which constitute adjacent cells, to each other.

The outer peripheral portions of the light absorbing layer 300, the buffer layer 400, the high resistance buffer layer 500, and the window layer 600 may substantially match with each other. In other words, the outer peripheral portions of the light absorbing layer 300, the buffer layer 400, the high resistance buffer layer 500, and the window layer 600 may correspond to each other. In this case, the outer peripheral portions of the light absorbing layer 300, the buffer layer 400, the high resistance buffer layer 500, and the window layer 600 may match with the boundary between the active region AR and the non-active region NAR.

Accordingly, the first and second bus bars 11 and 12 are provided beside the light absorbing layer 300, the buffer layer 400, the high resistance buffer layer 500, and the window layer 600. In other words, the first and second bus bars 11 and 12 may surround the lateral sides of the light absorbing layer 300, the buffer layer 400, the high resistance buffer layer 500, and the window layer 600. In other words, the first and second bus bars 11 and 12 surround the first cell C1, the second cell C2, and the third cells C3.

In addition, the bottom surfaces of the first and second bus bars 11 and 12 are provided on the same plane as that of the bottom surface of the light absorbing layer 300. In other words, the bottom surfaces of the first and second bus bars 11 and 12 make contact with the top surface of the back electrode layer 200, and even the bottom surface of the light absorbing layer 300 makes contact with the top surface of the back electrode layer 200.

The first and second bus bars 11 and 12 may be connected to the back electrode layer 200 while directly making contact with the back electrode layer 200. In this case, the first and second bus bars 11 and 12 include metal such as silver (Ag). Similarly, the back electrode layer 200 may include metal such as molybdenum (Mo). That is, the first bus bar 11 and the second bus bar 12 include metal, and the back electrode layer 200 includes metal. Accordingly, metal-to-metal coupling characteristics are obtained between the first bus bar 11 and the back electrode layer 200 and between the second bus bar 12 and the back electrode layer 200. Therefore, the contact characteristic is improved between the first bus bar 11 and the back electrode layer 200 and between the second bus bar 12 and the back electrode layer 200.

Therefore, the contact resistance between the first bar 11 and the back electrode layer 200 and the contact resistance between the second bus bar 12 and the back electrode layer 200 are reduced, so that the solar cell apparatus according to the embodiment can represent improved electrical characteristic.

In addition, since the first bus bar 11 and the back electrode layer 200 have a high contact characteristic, and the second bus bar 12 and the back electrode layer 200 have a high contact characteristic, the first and second bus bars 11 and 12 may have a narrower area. In other words, even if the first bust bar 11 and the back electrode layer 200 make contact with each other with a small contact area, the first bus bar 11 is effectively connected to the back electrode layer 200. Similarly, even if the second bust bar 12 and the back electrode layer 200 make contact with each other with a small contact area, the second bus bar 12 is effectively connected to the back electrode layer 200.

Actually, the first and second bus bars 11 and 12 do not contribute to the solar cell apparatus. As described above, according to the solar cell apparatus of the embodiment, the areas of the first bus bar 11 and the second bus bar 12, that is, areas that do not contribute to the solar power generation can be reduced.

In addition, the first and second bus bars 11 and 12 are provided in the non-active region NAR. Therefore, the solar cell apparatus according to the embodiment can more efficiently receive the sunlight as compared with a case in which the bus bars 11 and 12 are provided in the active region.

Therefore, the solar cell apparatus according to the embodiment can convert the greater quantity of the sunlight into electrical energy.

FIGS. 3 to 10 are views showing a method of manufacturing the solar cell apparatus according to other embodiments. In the following description, the method of manufacturing the solar cell apparatus according to the present embodiment will be described by making reference to the description of the solar cell apparatus. In other words, the above description of the solar cell apparatus may be incorporated in the description of the method of manufacturing the solar cell apparatus according to the present embodiment.

Figure 3:
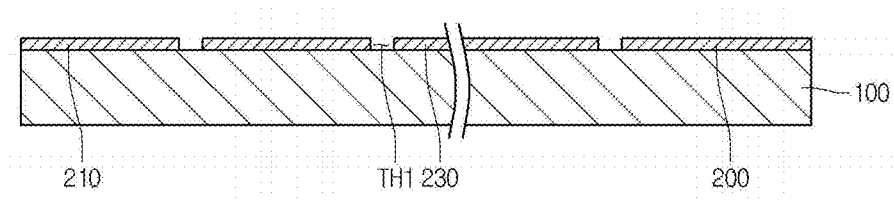
FIGS. 3 to 10 are views showing a method of manufacturing the solar cell apparatus according to other embodiments.

Referring to FIG. 3, the back electrode layer 200 is formed on the support substrate 100, and the first through holes TH1 are formed by patterning the back electrode layer 200. Therefore, the back electrodes 201, 202, and 230, and the first and second connection electrodes 210 and 220 are formed on the support substrate 100. The back electrode layer 200 is patterned by laser.

The first through holes TH1 may expose the top surface of the support substrate 100, and may have a width in the range of about 80 μm to about 200 μm.

In addition, an additional layer such as an anti-diffusion layer may be interposed between the supports substrate 100 and the back electrode layer 200. In this case, the first through holes TH1 expose the top surface of the additional layer.

Figure 4:
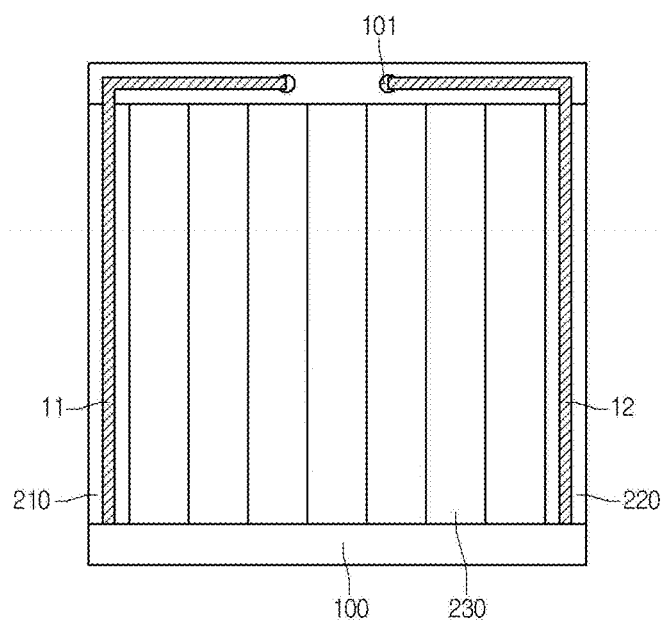
Figure 5:
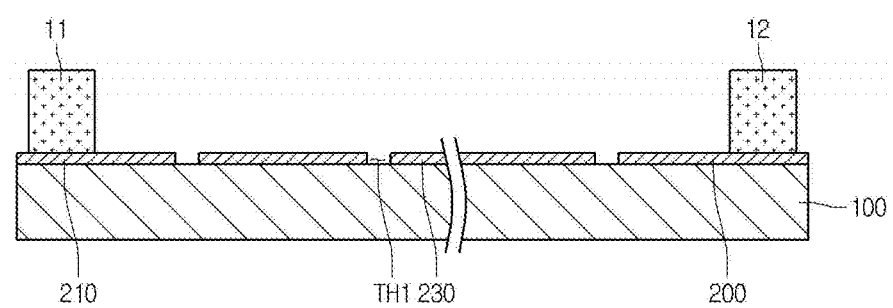

Referring to FIGS. 4 and 5, the first bus bar 11 and the second bus bar 12 are formed on the back electrode layer 200.

The first bus bar 11 and the second bus bar 12 are formed along the outer peripheral portion of the support substrate 100. The first bus bar 11 and the second bus bar 12 are partially formed on the first connection electrode 210 and the second connection electrode 220, respectively.

In order to form the first bus bar 11 and the second bus bar 12, a conductive paste is printed on the first connection electrode 210, the second connection electrode 220, and the support substrate 100. In detail, the conductive paste is printed even in through holes 101 formed in the substrate 100.

After that, the printed conductive paste is heat-treated, and the first bus bar 11 and the second bus bar 12 are formed.

In addition, the first bus bar 11 and the second bus bar 12 may be formed by a vacuum deposition scheme. A deposition mask 20 including a transmission part corresponding to the first bus bar 11 and the second bus bar 12 is provided on the support substrate 100. A conductive material is deposited on the back electrode layer 200 and the support substrate 100 through the deposition mask 20. Accordingly, the first bus bar 11 and the second bus bar 12 may be formed.

Figure 6:
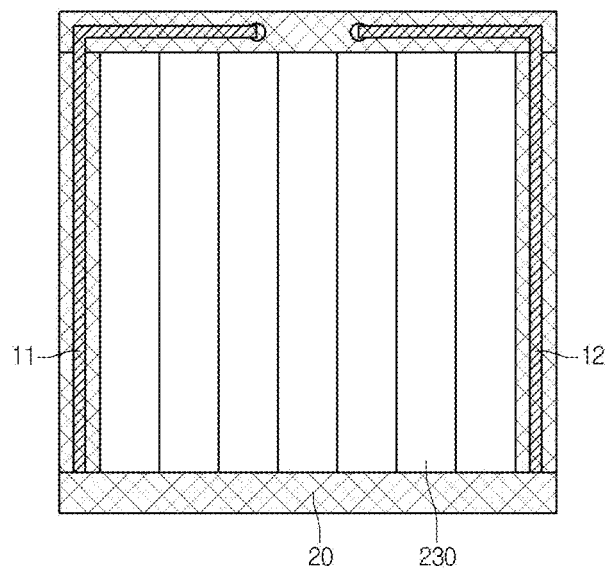
Figure 7:
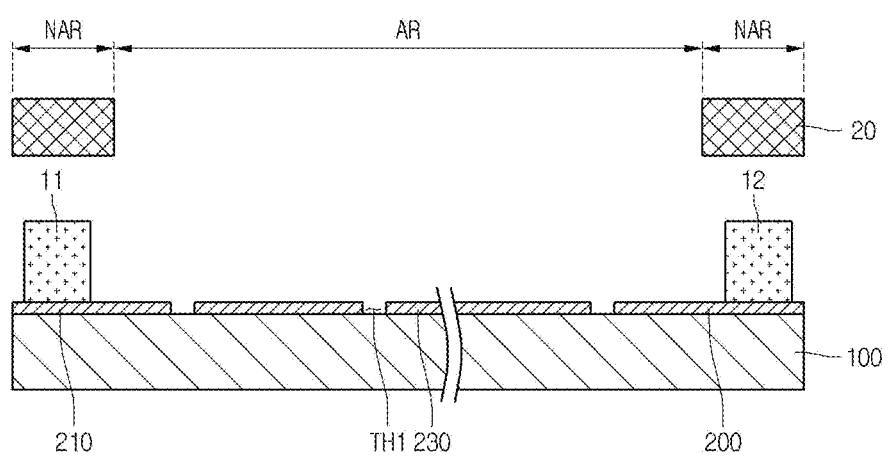

Thereafter, referring to FIGS. 6 and 7, a mask 20 is provided on the support substrate 100 to cover the first and second bus bars 11 and 12.

The mask 20 covers the outer peripheral portion of the support substrate 100. The mask 20 may have a ring shape when viewed from in a plan view. The mask 20 includes a transmissive region formed at the central portion thereof.

Although the mask 20 is spaced apart from the support substrate 100 in accompanying drawings, the embodiment is not limited thereto. In other words, the mask 20 may adhere to the support substrate 100.

The active region AR and the non-active region NAR are defined by the mask 20. In other words, a portion of the mask 20 corresponding to the transmissive region corresponds to the active region AR, and a non-transmissive region having a ring shape corresponds to the non-active region NAR.

Figure 8:
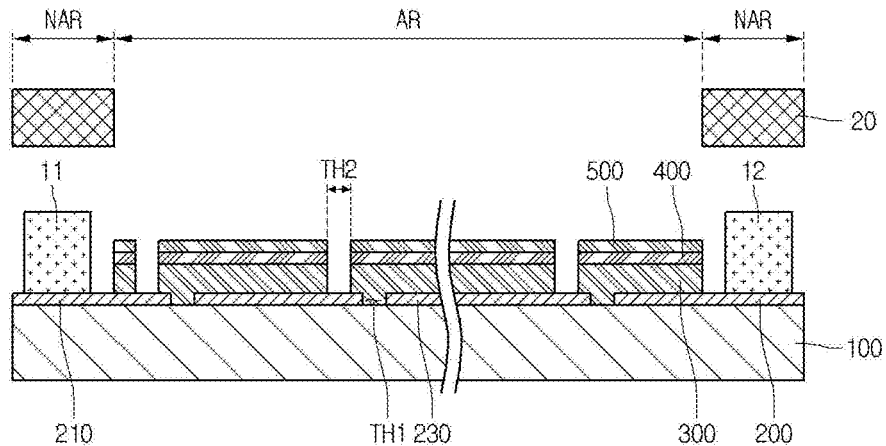

Referring to FIG. 8, the light absorbing layer 300, the buffer layer 400, and the high resistance buffer layer 500 are formed on the back electrode layer 200. The light absorbing layer 300, the buffer layer 400, and the high resistance buffer layer 500 are formed through a deposition process using the mask 50. Therefore, the light absorbing layer 300, the buffer layer 400, and the high resistance buffer layer 500 are formed in the active region AR.

The light absorbing layer 300 may be formed through a sputtering process or an evaporation scheme in the state that the mask 20 is mounted on the support substrate 100.

For example, in order to form the light absorbing layer 300, a scheme of forming a Cu(In,Ga)Se2 (CIGS) based-light absorbing layer 300 by simultaneously or separately evaporating Cu, In, Ga, and Se and a scheme of performing a selenization process after forming a metallic precursor film have been extensively performed.

Regarding the details of the selenization process after forming the metallic precursor layer, the metallic precursor layer is formed on the back electrode 200 through a sputtering process employing a Cu target, an In target, or a Ga target.

Thereafter, the metallic precursor layer is subject to the selenization process so that the Cu(In,Ga)Se2 (CIGS) based-light absorbing layer 300 is formed.

In addition, the sputtering process employing the Cu target, the In target, and the Ga target and the selenization process may be simultaneously performed.

Furthermore, a CIS or a CIG light absorbing layer 300 may be formed through a sputtering process employing only Cu and In targets or only Cu and Ga targets and the selenization process.

Thereafter, the buffer layer 400 may be formed after depositing CdS through a sputtering process or a CBD (chemical bath deposition) scheme in the state that the mask 20 is mounted.

Next, in the state that the mask 20 is mounted, the high resistance buffer layer 500 is formed by depositing zinc oxide on the buffer layer 400 through a sputtering process.

The buffer layer 400 and the high resistance buffer layer 500 are deposited at a low thickness. For example, the thicknesses of the buffer layer 400 and the high resistance buffer layer may be in the range of about 1 nm to about 80 nm.

Thereafter, the second through holes TH2 are formed by partially removing the light absorbing layer 300, the buffer layer 400, and the high resistance buffer layer 500.

The second through holes TH2 may be formed by a mechanical device such as a tip or a laser device.

For example, the light absorbing layer 300 and the buffer layer 400 may be patterned by a tip having a width of about 40 μm to about 180 μm. In addition, the second through holes TH2 may be formed by a laser having the wavelength of about 200 nm to about 600 nm.

In this case, the width of the second through holes TH2 may be in the range of about 100 μm to about 200 μm. In addition, the second through holes TH2 are formed to partially expose the top surface of the back electrode layer 200.

Figure 9:
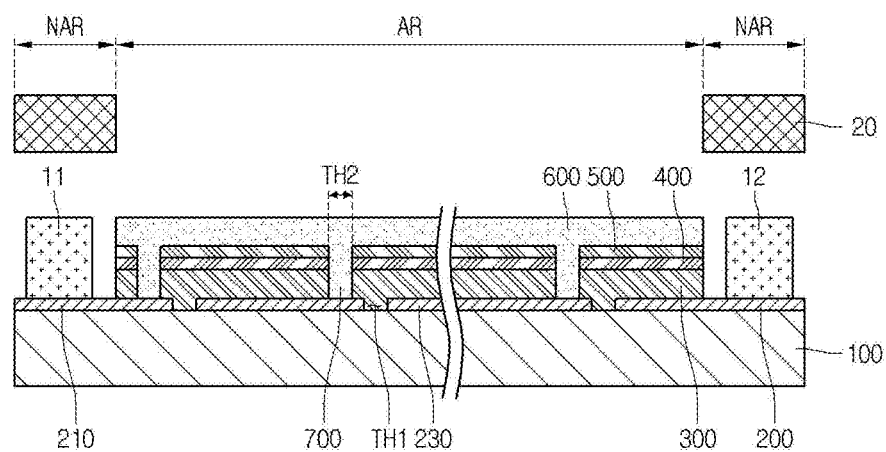

Referring to FIG. 9, in the state in which the mask 20 is mounted, the window layer 600 is formed on the light absorbing layer 300 and inside the second through holes TH2. In other words, the window layer 600 is formed by depositing a transparent conductive material on the high resistance buffer layer 500 and inside the second through holes TH2.

In this case, after filling the transparent conductive material inside the second through holes TH2, the window layer 600 directly makes contact with the back electrode layer 200.

Figure 10:
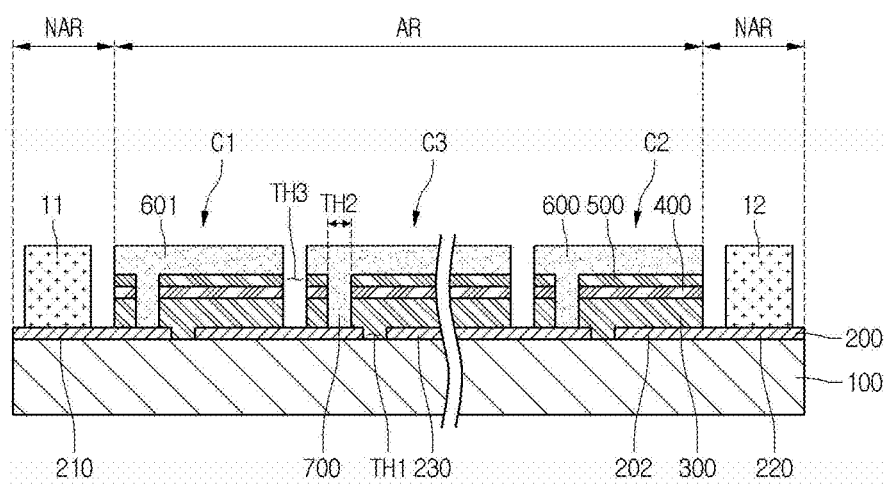

Referring to FIG. 10, the mask 20 is removed, and the third through holes TH3 are formed by removing portions of the light absorbing layer 300, the buffer layer 400, the high resistance buffer layer 500, and the window layer 600. Accordingly, the window layer 600 is patterned to define a plurality of windows, the first cell C1, the second cell C2, and the third cells C3. The width of the third through holes TH3 may be in the range of about 80 μm to about 200 μm.

As described above, the solar cell apparatus according to the embodiment is formed. The first and second bus bars 11 and 12 are formed prior to the light absorbing layer 300 such that the first and second bus bars 11 and 12 are connected to the back electrode layer 200. Accordingly, the solar cell apparatus according to the embodiment may represent high photoelectric conversion efficiency with an improved electrical characteristic.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The solar cell apparatus according to embodiment is applicable to a solar cell generation field.

The invention claimed is:
1. A solar cell apparatus comprising:
a substrate;
a back electrode layer on the substrate;
a light absorbing layer on the back electrode layer;
a window layer on the light absorbing layer; and
a bus bar provided beside the light absorbing layer, the bus bar being connected to the back electrode layer,
wherein the substrate comprises:
a non-active region corresponding to an outer peripheral portion of the substrate; and
an active region inside the non-active region,
wherein the bus bar is provided in the non-active region, and the light absorbing layer and the window layer are provided in the active region,
wherein the back electrode layer comprises a plurality of back electrodes and a connection electrode extending from the active region to the non-active region, and the bus bar directly makes contact with the connection electrode,
wherein the bus bar includes a first bus bar and a second bus bar,
wherein the first bus bar is connected to a window of a first cell through a first connection electrode,
wherein the second bus bar is connected to a back electrode of a second cell through a second connection electrode,
wherein the window layer includes a plurality of windows and a plurality of connection parts,
wherein each connection part of the connection parts connects one window of the plurality of windows and one back electrode of the plurality of back electrodes to each other,
wherein the back electrode layer comprises a first metal, and the bus bar comprises a second metal different from the first metal,
wherein the first metal comprises molybdenum (Mo),
wherein the bus bar comprises silver (Ag),
wherein a thickness of the window layer is from 800 nm to 1200 nm,
wherein a thickness of the bus bar corresponds to a sum of the thickness of the window layer and a thickness of one of the connection parts,
wherein an entire upper surface of the bus bar is at a same level as an upper surface of the window layer,
wherein the bus bar is a single layer, and
wherein the light absorbing layer comprises Cu(In,Ga)Se2(CIGS).

2. The solar cell apparatus of claim 1, wherein a bottom surface of the light absorbing layer is aligned on a same plane with a bottom surface of the bus bar.

3. The solar cell apparatus of claim 1, wherein the bus bar comprises a first bar and a second bar which are provided in parallel to each other, and the light absorbing layer and the window layer are interposed between the first bus bar and the second bus bar.

4. The solar cell apparatus of claim 1, wherein the bus bar is provided beside the window layer.

5. The solar cell apparatus of claim 1, the substrate including an active area and a non-active area surrounding the active area;
a first bus bar in the non-active region;
a first cell in the active area; and
a first connection electrode connecting the first cell to the first bus bar,
wherein the first cell comprises:
a first back electrode on the substrate;
a first light absorbing part on the first back electrode; and
a first window on the first light absorbing part, and
wherein the first connection electrode extends from the first back electrode to the non-active region.

6. The solar cell apparatus of claim 5, further comprising:
a second bus bar in the non-active region;
a second cell in the active region; and
a second connection electrode connecting the second cell to the second bus bar.

7. The solar cell apparatus of claim 6, wherein the second cell comprises:
a second back electrode on the substrate;
a second light absorbing part on the second back electrode; and
a second window on the second light absorbing layer, and
wherein the second connection electrode is provided at a same layer with the second back electrode and is connected to the second window.

8. The solar cell apparatus of claim 6, further comprising a plurality of third cells between the first cell and the second cell, and
wherein the first cell, the second cell, and the third cells are connected to each other in series.

9. The solar cell apparatus of claim 7, wherein the first back electrode is integrally formed with the first connection electrode.

* * * * *